United States Patent
Jin

(10) Patent No.: US 11,239,088 B2
(45) Date of Patent: Feb. 1, 2022

(54) SEMICONDUCTOR DEVICE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 1 day.

(21) Appl. No.: 16/816,559

(22) Filed: Mar. 12, 2020

(65) Prior Publication Data

US 2020/0294810 A1 Sep. 17, 2020

(30) Foreign Application Priority Data

Mar. 13, 2019 (CN) .......................... 201910189265.3

(51) Int. Cl.
*H01L 21/308* (2006.01)
*H01L 21/02* (2006.01)

(52) U.S. Cl.
CPC ...... *H01L 21/3088* (2013.01); *H01L 21/0214* (2013.01); *H01L 21/0217* (2013.01); *H01L 21/0228* (2013.01); *H01L 21/02164* (2013.01); *H01L 21/02167* (2013.01); *H01L 21/3081* (2013.01); *H01L 21/3085* (2013.01); *H01L 21/3086* (2013.01)

(58) Field of Classification Search
None
See application file for complete search history.

(56) References Cited

U.S. PATENT DOCUMENTS

2020/0227267 A1* 7/2020 Baykan ............... H01L 29/7853
2020/0235204 A1* 7/2020 Cheng ................. H01L 27/0886

* cited by examiner

*Primary Examiner* — Asok K Sarkar
(74) *Attorney, Agent, or Firm* — Anova Law Group, PLLC

(57) ABSTRACT

Semiconductor device and fabrication method are provided. A plurality of first-type fin groups and second-type fins, each between the first-type fin groups, are formed on a substrate. A first-type fin group includes first-type fins. The first-type fins and the second-type fins are arranged in a direction perpendicular to an extending direction of the first-type fins and the second-type fins. The second-type fins are removed to form first trenches between corresponding first-type fin groups. A protective layer is formed on sidewalls of the first trenches after removing the second-type fins. The protective layer covers sidewalls of the first-type fins that are perpendicular to a width direction of the first-type fins. Second trenches are formed in the substrate under the first trenches by etching the substrate at bottoms of the first trenches using the protective layer as an etch mask.

20 Claims, 11 Drawing Sheets

SEMICONDUCTOR DEVICE AND FORMATION METHOD THEREOF

CROSS-REFERENCES TO RELATED APPLICATION

This application claims the priority of Chinese Patent Application No. 201910189265.3, filed on Mar. 13, 2019, the content of which is incorporated by reference in its entirety.

TECHNICAL FIELD

The present disclosure generally relates to the field of semiconductor technology and, more particularly, to a semiconductor device and a method of forming the same.

BACKGROUND

Metal-oxide-semiconductor (MOS) transistors are one of the most important components in modern integrated circuits. A basic structure of a MOS transistor includes a substrate, a gate structure on the surface of the substrate, and source-drain regions on both sides of the gate structure in the substrate. The gate structure includes a gate dielectric layer on the surface of the substrate and a gate electrode layer on the surface of the gate dielectric layer.

Conventional planar MOS transistors have poor control over channel current, resulting in severe current leakage. A fin field-effect transistor (Fin FET) is an emerging multi-gate device that generally includes a fin protruding from the surface of a substrate, a gate structure covering a portion of top surface and sidewalls of the fin, and source-drain regions on both sides of the gate structure in the fin.

However, the performance of semiconductor devices of fin field-effect transistors still needs to be improved.

SUMMARY

One aspect of the present disclosure provides a method of forming a semiconductor device. In the method, a plurality of first-type fin groups and second-type fins, each between the first-type fin groups, are formed on a substrate. A first-type fin group includes first-type fins. The first-type fins and the second-type fins are arranged in a direction perpendicular to an extending direction of the first-type fins and the second-type fins. The second-type fins are removed to form first trenches between corresponding first-type fin groups. A protective layer is formed on sidewalls of the first trenches after removing the second-type fins. The protective layer covers sidewalls of the first-type fins that are perpendicular to a width direction of the first-type fins. Second trenches are formed in the substrate under the first trenches by etching the substrate at bottoms of the first trenches using the protective layer as an etch mask.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
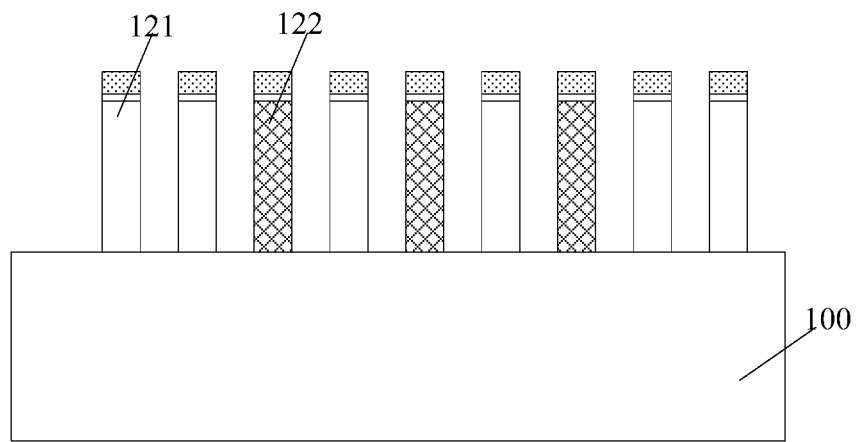
FIGS. 1-3 illustrate structures during formation of a semiconductor device.
Figure 2:
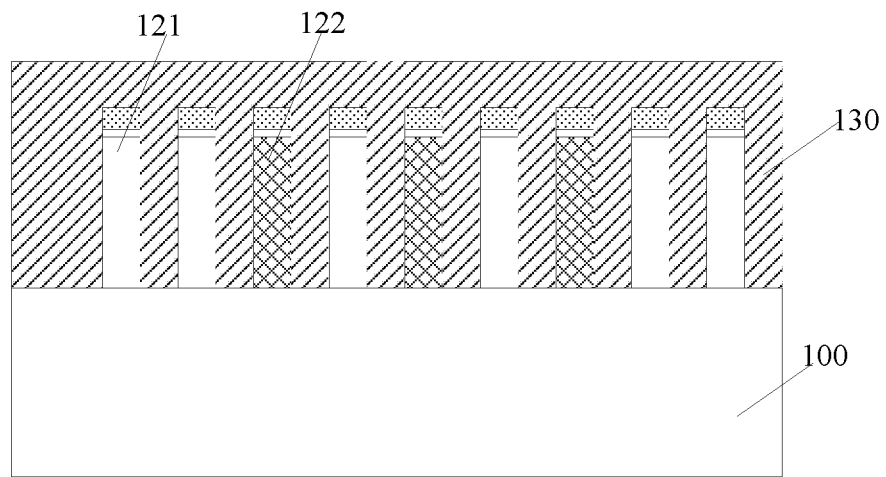
Figure 3:
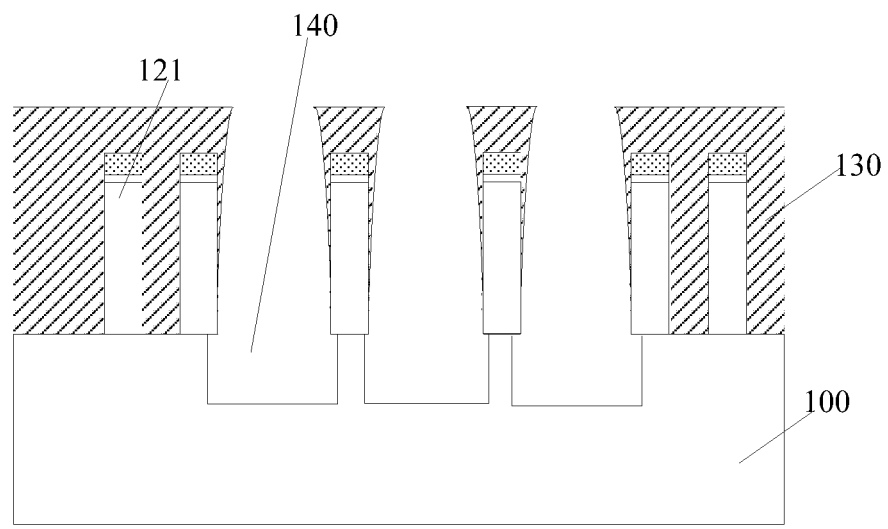

FIGS. 1-3 illustrate structures during formation of a semiconductor device. Referring to FIG. 1, a substrate 100 is provided. A plurality of fins are formed on the substrate. The fins are arranged along a width direction of the fins and are categorized as first-type fins 121 and second-type fins 122. The fins are formed using a quadruple patterning such that the distance between adjacent first-type fins 121 is small, which increases the density of first-type fins 121. The second-type fins 122 are useless fins in a circuit, thus the second-type fins 122 are removed to meet the design requirements of circuit layout.

Referring to FIG. 2, a sacrificial layer 130 is formed between adjacent fins. The sacrificial layer 130 fills the space between adjacent fins, and areas of the filled regions are large. After the removal of second-type fins 122, the remaining sacrificial layer 130 still needs to be removed. During removing second-type fins by etching, the sacrificial layer 130 covering second-type fins 122 also needs to be removed by etching. Therefore, the sacrificial layer 130 is composed of materials generally chosen to be easily removed by etching. For example, the materials of sacrificial layer 130 include a carbon-containing organic polymer.

Referring to FIG. 3, after the formation of the sacrificial layer 130, etching is conducted to form trenches 140 by removing the second-type fins 122, a portion of the sacrificial layer 130, and a portion of the substrate 100. The trenches 140 extend into the substrate 100.

Before forming the trenches 140, a mask layer (not shown) is formed on the sacrificial layer 130 and first-type fins 121. The mask layer covers the first-type fins 121 and a portion of the sacrificial layer 130 on sidewalls of the first-type fins 121. The mask layer exposes the second-type fins 122 and a portion of the sacrificial layer 130 which cover sidewalls of the second-type fins 122. Openings in the mask layer 150 are used to position the trenches 140. Using the mask layer 150 as an etch mask, etching is used to remove the second-type fins 122, a portion of the sacrificial layer 130, and a portion of the substrate 100.

During etching away the second-type fins 122, it is desirable to retain a portion of the sacrificial layer 130 on surfaces of sidewalls of the first-type fins 121 facing the second-type fins 122 to protect surfaces of sidewalls of the first-type fins 121 facing the second-type fins 122.

For illustration purposes, regions of trenches 140 located in the substrate 100 are referred to as bottom-trench regions. Dimensions of bottom-trench regions in the width direction of second-type fins 122 are larger than the width of second-type fins 122. During etching the substrate 100 to form bottom-trench regions, etching rates per unit height for the substrate 100 are slow in a direction perpendicular to the surface of the substrate 100. Correspondingly, time for forming bottom-trench regions is longer than time for removing the second-type fins 122, and time for etching the substrate 100 to form bottom-trench regions is relatively long.

On one hand, position of the mask layer 150 is prone to shift, which results in an inconsistent thickness of the sacrificial layer 130 covering sidewalls of the first-type fins 121 on both sides of trenches 140 after the etching removal of second-type fins 122. On the other hand, during removing second-type fins 122 and etching the sacrificial layer 130 in a longitudinal direction of openings of the mask layer 150, the sacrificial layer 130 on sidewalls of the first-type fins 121 is also damaged in a lateral direction. Thus, a portion of sidewalls of the first-type fins 121 is prone to be exposed before forming the bottom-trench regions by etching the substrate. During forming the bottom-trench regions, a portion of sidewalls of the first-type fins 121 is damaged. Further, after the formation of the bottom-trench regions, the bottom-trench regions also expose a portion of bottom surfaces of adjacent first-type fins 121. Thus, the etching loss on bottom surfaces of the first-type fins 121 is large. In summary, these drawbacks result in poor performance of a semiconductor device.

To improve performance of semiconductor devices, the present disclosure provides a method of forming semiconductor devices. In an exemplary method, a plurality of first-type fin groups and second-type fins, each between the first-type fin groups, are formed on a substrate. A first-type fin group includes first-type fins. The first-type fins and the second-type fins are arranged in a direction perpendicular to an extending direction of the first-type fins and the second-type fins. The second-type fins are removed to form first trenches between corresponding first-type fin groups. A protective layer is formed on sidewalls of the first trenches after removing the second-type fins. The protective layer covers sidewalls of the first-type fins that are perpendicular to a width direction of the first-type fins. Second trenches are formed in the substrate under the first trenches by etching the substrate at bottoms of the first trenches using the protective layer as an etch mask. Performance of semiconductor devices is therefore improved.

To better clarify the aforementioned objects, features, and advantages of the present disclosure, embodiments are given below to elaborate on the present disclosure.

Figure 20:
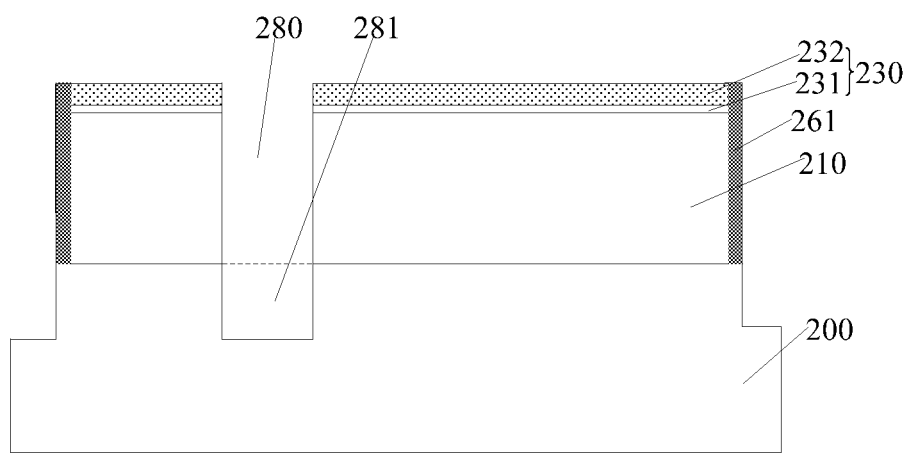
Figure 21:
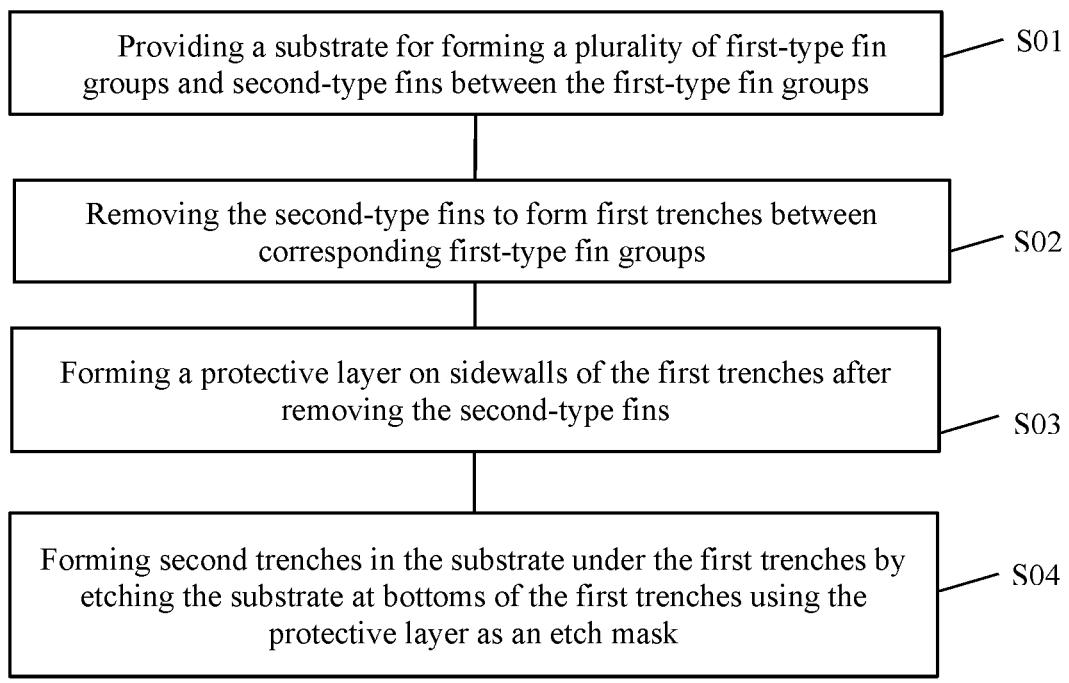
FIG. 21 illustrates an exemplary fabrication method of a semiconductor device consistent with various disclosed embodiments of the present disclosure.

FIG. 21 illustrates a flowchart of an exemplary method for fabricating a semiconductor device consistent with various disclosed embodiments in the present disclosure. FIGS. 4-20 illustrate schematic views of forming a semiconductor device at certain stages of an exemplary fabrication process.

Figure 4:
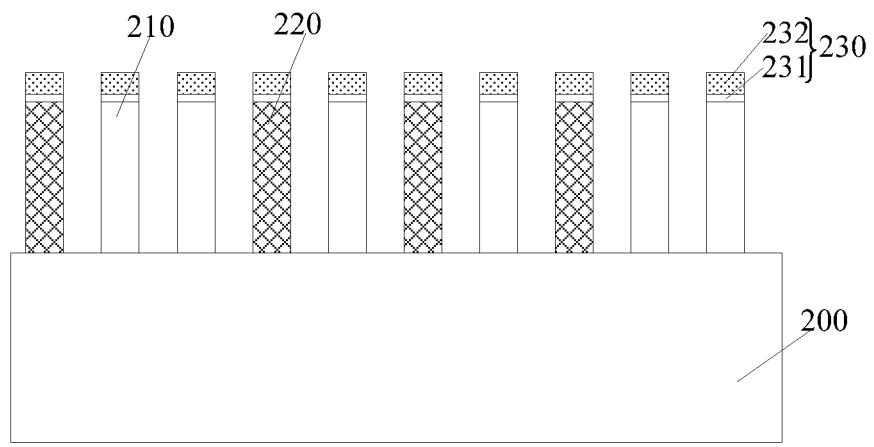
FIGS. 4-20 illustrate structures corresponding to certain stages during an exemplary fabrication process of a semiconductor device consistent with various disclosed embodiments of the present disclosure.

Referring to FIG. 21, at the beginning of the fabrication process, a substrate is provided and a plurality of first-type fin groups and second-type fins between the first-type fin groups are formed on the substrate (S01). FIG. 4 shows a schematic cross-section view of a corresponding semiconductor structure.

Referring to FIG. 4, a substrate 200 is provided. A plurality of first-type fin groups and second-type fins 220 between the first-type fin groups are formed on the substrate 200. The first-type fin groups include first-type fins 210. The first-type fins 210 and the second-type fins 220 are arranged in a direction perpendicular to an extending direction of first-type fins 210 and second-type fins 220.

The substrate 200 can be made from monocrystalline silicon, polycrystalline silicon, or amorphous silicon. The substrate 200 can also be made from a material including silicon, germanium, silicon germanium, gallium arsenide, and so on. The materials of substrate 200 can be a bulk material, or a composite such as silicon on insulator. The materials of substrate 200 can also be other semiconductor materials, which will not be exemplified herein. In one embodiment, the material of substrate 200 is monocrystalline silicon.

The materials of first-type fins 210 and second-type fins 220 include monocrystalline silicon or monocrystalline germanium silicon. In one embodiment, the materials of first-type fins 210 and second-type fins 220 are monocrystalline silicon.

The extending direction of first-type fins 210 is parallel to the extending direction of second-type fins 220.

The first-type fins 210 extend in a direction parallel to the surface of the substrate 200 and perpendicular to a width direction of first-type fins 210, while the second-type fins 220 extend in a direction parallel to the surface of the substrate 200 and perpendicular to a width direction of second-type fins 220.

In one embodiment, the method for forming the substrate, the first-type fins 210, and the second-type fins 220 includes: providing an initial substrate; etching the initial substrate to form first-type fins 210 and second-type fins 220; and forming a substrate in the initial substrate under the first-type fins 210 and second-type fins 220. In other embodiments, a substrate is provided, a fin material layer is formed on the substrate, and first-type fins 210 and second-type fins 220 are formed by patterning the fin material layer.

In one embodiment, first-type fins 210 and second-type fins 220 are formed by a quadruple patterning, such that a distance is small between adjacent first-type fins 210, between adjacent second-type fins 220, and between adjacent first-type fins 210 and second-type fins 220.

In one embodiment, at least a portion of the first-type fin groups includes a plurality of first-type fins 210. For the plurality of first-type fins 210 in a same first-type fin group, a groove is formed between adjacent first-type fins.

In one embodiment, a portion of the first-type fin groups include a plurality of first-type fins 210, and a portion of the first-type fin groups include a single first-type fin 210. In another embodiment, each of the first-type fin groups includes a plurality of first-type fins 210.

One or more second-type fins 220 are formed between adjacent first-type fin groups. In one embodiment, the number of second-type fins 220 formed between adjacent first-type fin groups is one.

There is an equal distance between adjacent first-type fins 210 in a same first-type fin group, between adjacent first-type fins 210 and second-type fins 220, and between adjacent second-type fins 220 located in adjacent first-type fin groups.

In one embodiment, the quadruple patterning includes: forming a liner film on the initial substrate by oxidation; forming a fin mask material layer on the liner film; forming a transfer film on the fin mask material layer; forming an etch barrier film on the transfer film; forming a first-core film on the etch barrier film; forming a plurality of discrete second-core layers on the first-core film; forming a first-spacer on the sidewall of the second-core layer, materials of the first spacer are different from materials of the first-core film and the second-core layer; removing the second-core layer after the formation of the first spacer; after removing the second-core layer, etching the first-core film using the first spacer as a mask until the surface of the etch barrier film is exposed, so that a plurality of discrete second-core layers are formed from the first-core film located at the bottom of the first spacer; after forming the second-core layer, removing the first spacer; after removing the first spacer, forming a second spacer on the sidewall of the second-core layer, materials of the second spacer are different from materials of the second-core layer; after forming the second spacer, removing the second-core layer; after removing the second-core layer, etching the etch barrier film using the second spacer as a mask until the surface of the transfer film is exposed, so that a plurality of discrete etch barrier layers are formed from the etch barrier film located at the bottom of the second spacer; after forming the etch barrier layer, removing the second spacer; after removing the second spacer, etching the transfer film using the etch barrier layer as a mask until the surface of the fin mask material layer is exposed, such that a plurality of discrete transfer layers are formed from the transfer film located at the bottom of the etch barrier layer; after forming the transfer layer, removing the etch barrier layer; after removing the etch barrier layer, etching the fin mask material layer and the liner film with the transfer layer as a mask until the surface of the initial substrate is exposed, such that discrete fin mask layers are formed from the fin mask material layer at the bottom of the transfer layer, and discrete liner layers are formed from the liner film located at the bottom of the fin mask layer; after forming the fin mask layer and the liner layer, removing the transfer layer; after removing the transfer layer, etching the initial substrate using the fin mask layer and the liner layer as masks to form first-type fins 210 and second-type fins 220, and making the initial substrate at the bottom of first-type fins 210 and second-type fins 220 into a substrate.

Materials of the liner film include silicon oxide. Materials of the fin mask material layer include silicon nitride. Materials of the transfer film include silicon oxide. Materials of the etch barrier film include silicon nitride. Materials of the first-core film include amorphous silicon. Materials of the second-core layer include SiON, SiN, $SiO_2$, or a carbon-containing organic substance.

A mask structure 230 is formed on top surfaces of the first-type fins 210 and second-type fins 220, and the mask structure 230 includes a liner layer 231 and a fin mask layer 232 on top of the liner layer 231. Materials of the liner layer 231 include silicon oxide, and materials of the fin mask layer 232 include silicon nitride.

The function of the liner layer 231 includes: improving adhesion between the fin mask layer 232 and the first-type fins 210 and between the fin mask layer 232 and the second-type fins 220.

The liner layer 231 has a thickness of 50 angstroms to 100 angstroms. The fin mask layer 232 has a thickness of 100 angstroms to 500 angstroms, such as 300 angstroms.

The second-type fins 220 are etched away to form first trenches between first-type fin groups.

In one embodiment, the method also includes: forming a first sacrificial layer beside first-type fins and second-type fins before the etching removal of second-type fins, a top surface of the first sacrificial layer is higher or flush with top surface of first-type fins and second-type fins; removing the first sacrificial layer between the first-type fins groups during the etching removal of second-type fins; after removing second-type fins by etching and before forming a protective layer, removing the first sacrificial layer on sidewalls of first-type fins.

Figure 5:
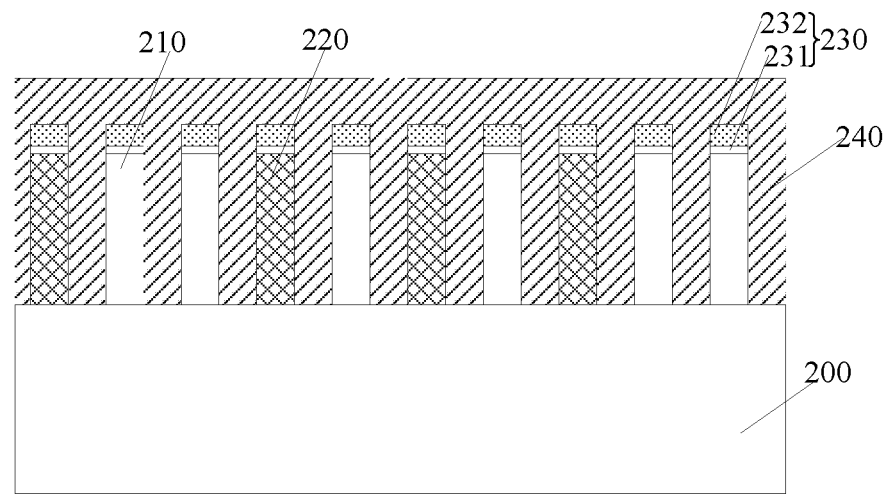

Referring to FIG. 5, the first sacrificial layer 240 is formed beside first-type fins 210 and second-type fins 220, top surface of the first sacrificial layer 240 is higher or flush with top surface of first-type fins 210 and second-type fins 220.

Materials of the first sacrificial layer 240 include carbon-containing organic polymers.

In one embodiment, the first sacrificial layer 240 is further located on top surface of first-type fins 210 and second-type fins 220. Specifically, the first sacrificial layer 240 further covers the mask structure 230.

Figure 6:
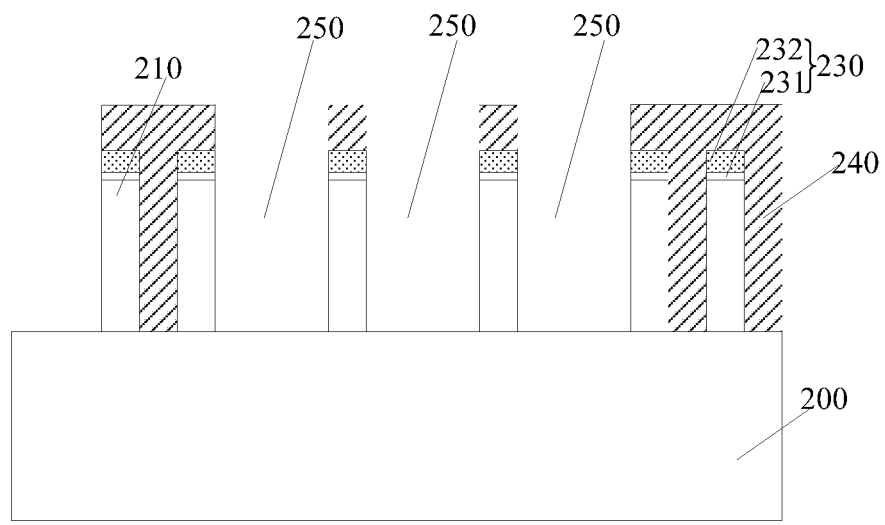

Further, returning to FIG. 21, first trenches between first-type fin groups may be formed by removing second-type fins (S02). FIG. 6 shows a schematic cross-section view of a corresponding semiconductor structure.

Referring to FIG. 6, after forming the first sacrificial layer 240, second-type fins 220 are etched away to form first trenches 250 between first-type fin groups.

A dimension of first trenches 250 along the width direction of first-type fins 210 is larger than dimension of the groove along the width direction of first-type fins 210.

In one embodiment, during the etching removal of second-type fins 220, the first sacrificial layer 240 between first-type fin groups is removed.

In one embodiment, multiple steps of removal are performed to remove all second-type fins 220. Each removal step removes a portion of second-type fins 220. When there are small numbers of first-type fins in a first-type fin group, and correspondingly, when there are small spacings between second-type fins on both sides of first-type fin groups, it is suitable to remove all second-type fins 220 by using a multiple-step removal.

In another embodiment, all second-type fins 220 are removed using a single-step removal. When there are large numbers of first-type fins in a first-type fin group, and correspondingly, when there are large spacings between second-type fins on both sides of first-type fin groups, it is suitable to remove all second-type fins 220 by using the single-step removal.

In one embodiment, second-type fins 220 are etched simultaneously with the etching of first sacrificial layer 240 between first-type fin groups in each removal step.

In another embodiment, each removal step includes a first sub-removal step and a second sub-removal step after the first sub-removal step. The first sub-removal step etches away a portion of first sacrificial layer 240 between first-type fin groups, and the second sub-removal step etches away a portion of second-type fins 220 between first-type fin groups. The second sub-removal step involves a portion of first-type fin groups, which is the same as that involved in the first sub-removal step.

In one embodiment, all second-type fins 220 are removed by using a two-step removal. The first step removes a portion of second-type fins 220 between adjacent first-type fin groups, and the second step removes the remaining second-type fins 220. The second-type fins 220 on one side of the first-type fin groups and the second-type fins 220 on the other side of the first-type fin group are removed in different removal steps. The first sacrificial layer includes a first sub-sacrificial layer and a second sub-sacrificial layer. The first sub-sacrificial layer is formed beside first-type fins 210 and second-type fins 220. Top surface of first sub-sacrificial layer is higher or flush with top surface of first-type fins 210 and second-type fins 220. After forming the first sub-sacrificial layer, a first photolithographic mask layer is formed on top of the first sub-sacrificial layer and first-type fins. The first photolithographic mask layer has first photolithographic openings, which expose a portion of second-type fins 220 between adjacent first-type fin groups and a portion of the first sub-sacrificial layer on sidewalls of corresponding second-type fins 220. Using the first photolithographic mask layer as a mask, second-type fins 220 and the first sub-sacrificial layer at the bottom of first photolithographic openings are removed by etching in the first removal step. First sub-trenches are formed between a portion of first-type fin groups, and sidewalls of first sub-trenches expose the first sub-sacrificial layer. That is, after the completion of the first sub-removal step, sidewalls of first-type fin groups adjacent to second-type fins 220, which are removed by the first sub-removal step, retain a portion of the first sub-sacrificial layer. Thereafter, the first photolithographic mask layer is removed. After the removal of first photolithographic mask layer, the remaining first sub-sacrificial layer is removed. Thereafter, the second sub-sacrificial layer is formed beside first-type fins and second-type fins. The second sub-sacrificial layer fills the first sub-trenches, and top surface of second sub-sacrificial layer is higher than or flush with top surface of first-type fins. After forming the second sub-sacrificial layer, a second photolithographic mask layer is formed on the second sub-sacrificial layer and first-type fins. The second photolithographic mask layer has second photolithographic openings, which expose the remaining second-type fins 220 and a portion of the second sub-sacrificial layer on sidewalls of second-type fins. The second-type fins and second sub-sacrificial layer at the bottom of photolithographic openings are removed by etching in the second removal step, forming second sub-trenches between a portion of first-type fin groups. Sidewalls of the second sub-trenches expose the second sub-sacrificial layer. That is, after the completion of the second sub-removal step, sidewalls of first-type fin groups adjacent to second-type fins 220, which are removed by the second sub-removal step, retain a portion of the second sub-sacrificial layer. Thereafter, the second photolithographic mask layer is removed. After the removal of the second photolithographic mask layer, the remaining second sub-sacrificial layer is removed.

The second-type fins 220 have a small width. In each removal step, etching rates per unit height for the second-type fins 220 are fast in a direction perpendicular to the surface of the substrate, thus the required etching time is short.

In each removal step, etching rates per unit height for the second-type fins 220 are fast in a direction perpendicular to the surface of the substrate, while etching rates per unit height for the substrate are slow in the direction perpendicular to the surface of the substrate. Thus, by comparing the etching rates, a critical time point can be easily detected when the substrate under the second-type fins 220 is exposed by removing second-type fins 220.

During etching away second-type fins 220, the mask structure 230 on top of the second-type fins 220 is also etched away.

Figure 7:
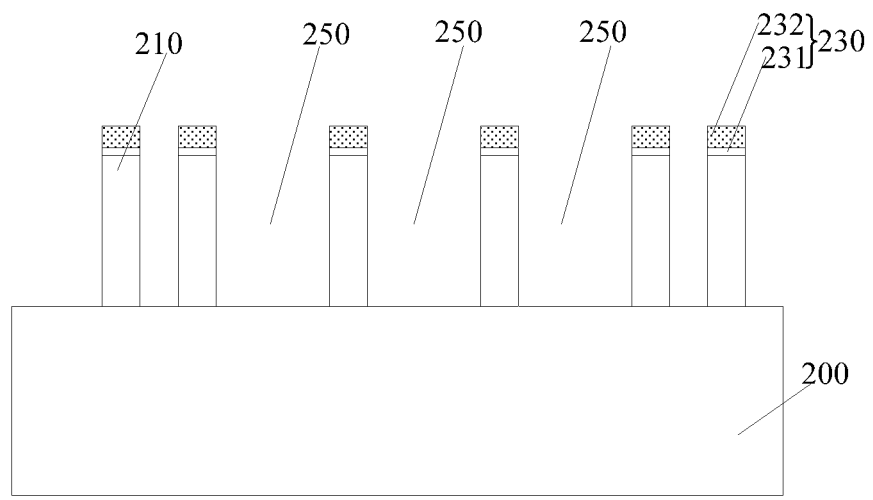

Referring to FIG. 7, after the etching removal of second-type fins 220, the first sacrificial layer 240 beside first-type fins 210 is removed.

The process of removing the first sacrificial layer 240 beside first-type fins 210 includes a dry etching or a wet etching.

In one embodiment, after the etching removal of second-type fins 220, the first sacrificial layer 240 beside and on top of first-type fins 210 is removed.

After the etching removal of second-type fins 220, a protective layer 261 is formed on sidewalls of first trenches 250, and the protective layer 261 covers sidewalls of first-type fins 210 that are perpendicular to a width direction of the first-type fins 210. Using the protective layer 261 as an etch mask, second trenches are formed in the substrate 200 under the first trenches 250 by etching the substrate 200 under the first trenches 250.

In one embodiment, the protective layer 261 is formed after the removal of the first sacrificial layer 240 beside and on top of the first-type fins 210.

In one embodiment, the method also includes: after forming the first trenches 250 and before forming the second trenches, cutting out a portion of a first-type fin along the extending direction of the first-type fin 210 to form a cutting groove in the first-type fin. Bottom areas of the cutting groove expose the substrate 200.

In one embodiment, the cutting groove is formed after the formation of the protective layer. The cutting groove penetrates the protective layer on sidewalls of a first-type fin. That is, the cutting groove runs through the protective layer on sidewalls of a first-type fin along the width direction of the first-type fin.

In another embodiment, the cutting groove is formed after the formation of first trenches and before the formation of protective layer. Specifically, the cutting groove is formed before the formation of the protective film. The protective layer is further located on sidewalls of cutting groove that are perpendicular to an extending direction of a first-type fin.

In another embodiment, the cutting groove is formed during the formation of the protective layer.

In one embodiment, the cutting groove is formed during the formation of the protective layer as an example for explanation.

Figure 8:
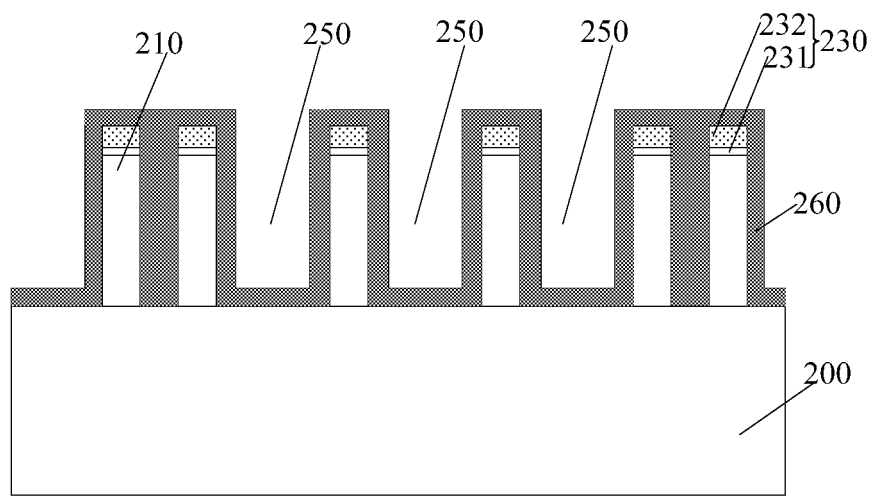

Further, returning to FIG. 21, the protective layer on sidewalls of the first trenches may be formed after removing the second-type fins (S03). FIG. 8 shows a schematic cross-section view of a corresponding semiconductor structure.

Referring to FIG. 8, a protective film 260 is formed on sidewalls and bottom of first trenches 250, inner of the groove, as well as on top of first-type fins 210.

Materials of protective films 260 include $SiO_2$, SiN, SiON, or SiC.

In one embodiment, the protective film 260 further covers sidewall surfaces and top surfaces of the mask structure 230 located on top of first-type fins 210.

The protective film 260 is formed by a deposition process such as an atomic layer deposition process.

In one embodiment, the protective film 260 is formed by an atomic layer deposition process, which enables a high quality of protective film 260 and a good etching resistance of subsequent protective layer.

Thickness of the protective film 260 on sidewalls of the first trenches 250 is equal or larger than half width of the groove in the width direction of first-type fins 210, such that the protective film 260 can fully fill the groove.

In one embodiment, thickness of the protective film 260 on sidewalls of the first trenches 250 is smaller than half width of a first trench 250 in the width direction of the first-type fins 210.

In one embodiment, thickness of the protective film 260 on sidewalls of the first trenches 250 is 100 angstroms to 200 angstroms. As used herein, the thickness of the protective film 260 refers to any thickness of the protective film 260 on any side of sidewalls of the first trenches 250.

Figure 9:
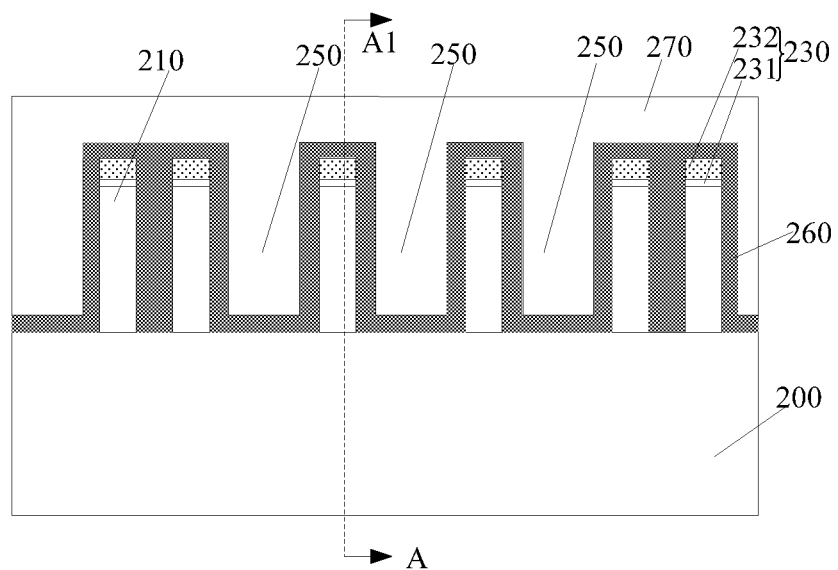
Figure 10:
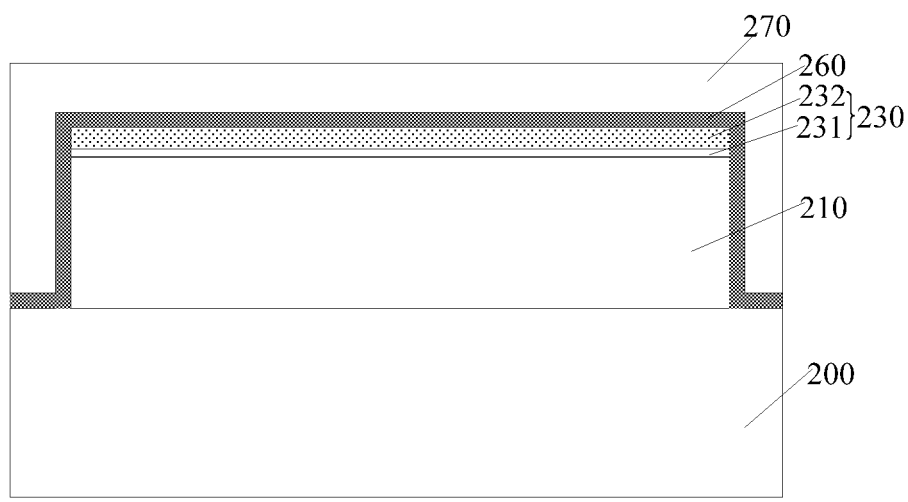
Figure 11:
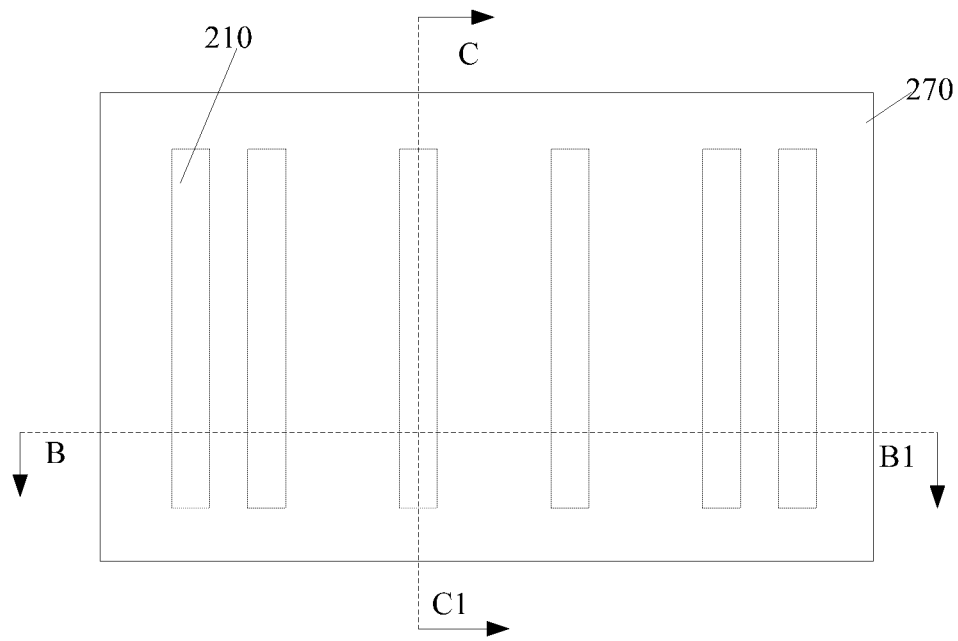

Referring to FIGS. 9-11, FIG. 9 is a schematic view based on the structure shown in FIG. 8, FIG. 10 is a cross-sectional view along the cutting line A-A1 shown in FIG. 9, FIG. 11 is a top view based on the structure shown in FIG. 9, FIG. 9 is a cross-sectional view along B-B1 shown in FIG. 11, and FIG. 10 is a cross-sectional view along the cutting line C-C1 shown in FIG. 11. A second sacrificial layer 270 is formed beside the first-type fins 210. Top surface of the second sacrificial layer 270 is higher or flush with the top surface of first-type fins 210.

The whole surface of second sacrificial layer 270 is higher or flush with top surface of first-type fin 210.

Materials of the second sacrificial layer 270 include, for example, a carbon-containing organic polymer.

The second sacrificial layer 270 is further located on top surface of the first-type fins 210. The second sacrificial layer 270 also covers the mask structure 230.

Figure 12:
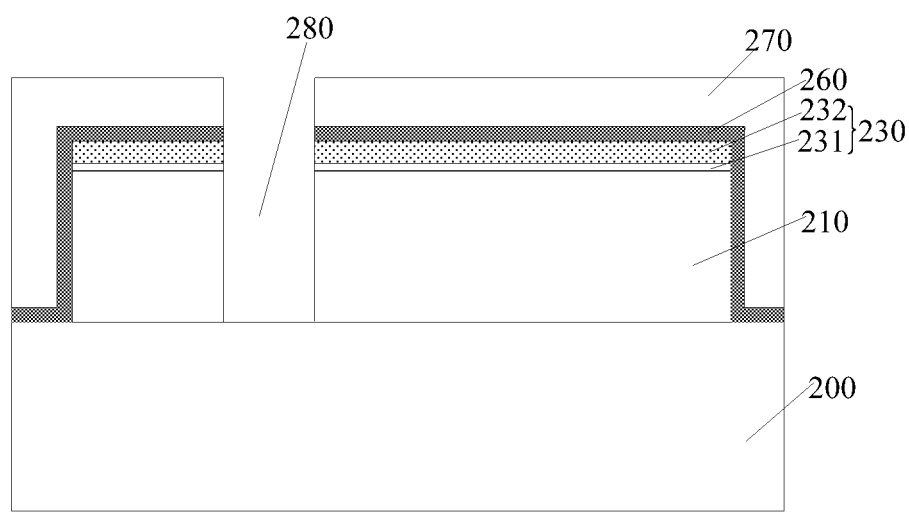
Figure 13:
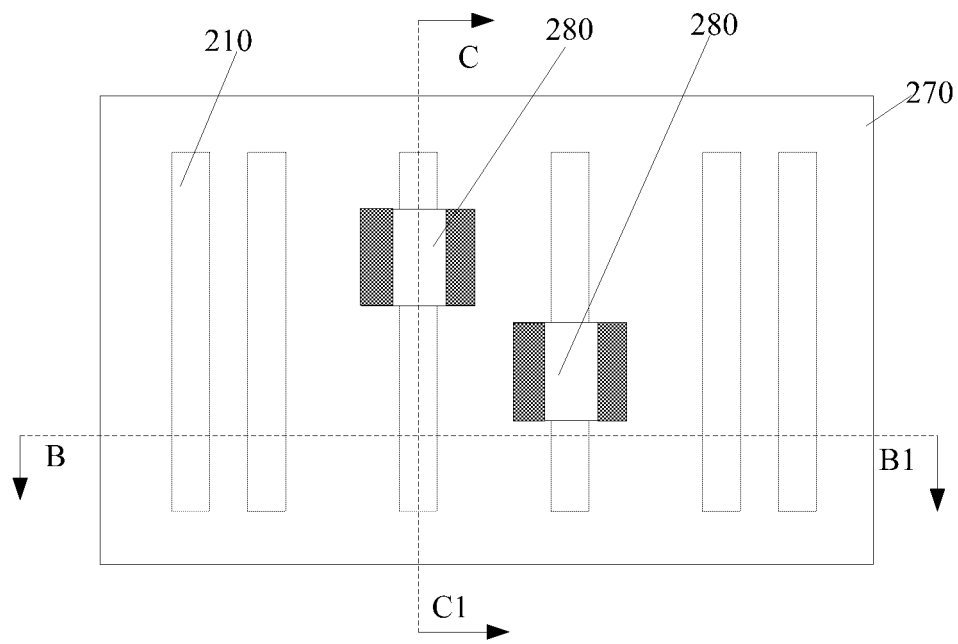

Referring to FIG. 12 and FIG. 13, FIG. 12 is a schematic view based on the structure shown in FIG. 10, FIG. 13 is a schematic view based on the structure shown in FIG. 11, and FIG. 12 is a cross-sectional view along the cutting line C-C1 of a first-type fin 210 in FIG. 13.

Referring to FIGS. 12-13, after forming the second sacrificial layer 270, a portion of the first-type fin 210 along the extending direction of the first-type fins 210 is removed to form a cutting groove 280 inside the first-type fin 210 to disconnect the first-type fin 210. A bottom of the cutting groove 280 exposes the substrate 200. During cutting a first-type fin 210 along the extending direction of the first-type fin 210, a portion of the second sacrificial layer 270 on both sides of the first-type fin 210 that are perpendicular to the width direction of the first-type fin 210 is removed.

In one embodiment, since the protective film 260 is formed before cutting out a portion of a first-type fin 210 along the extending direction of the first-type fin 210, the protective film 260 on the surface of the substrate can serve as a barrier layer for etching during cutting out a portion of a first-type fin 210 along the extending direction of the first-type fin 210. Further, thickness of the protective film 260 is not thick, so that the cutting of a first-type fin 210 along the extending direction of the first-type fin 210 can be accurately controlled until reaching a critical time point at which the surface of the substrate is exposed.

Figure 14:
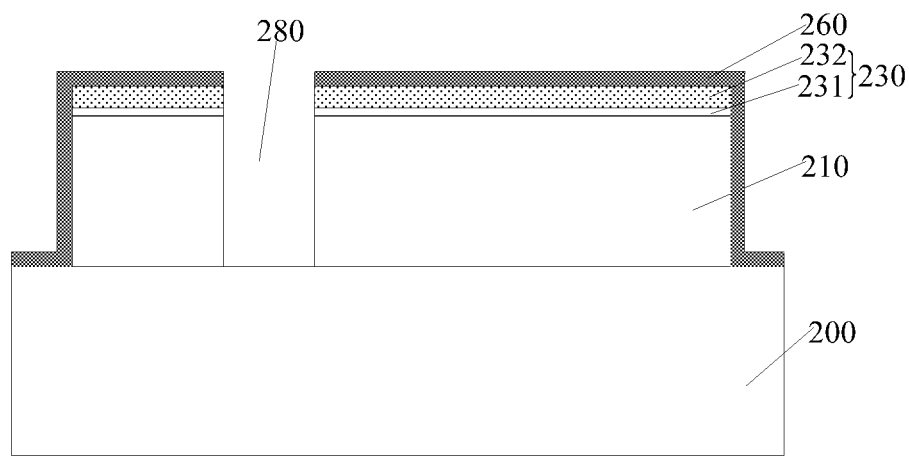
Figure 15:
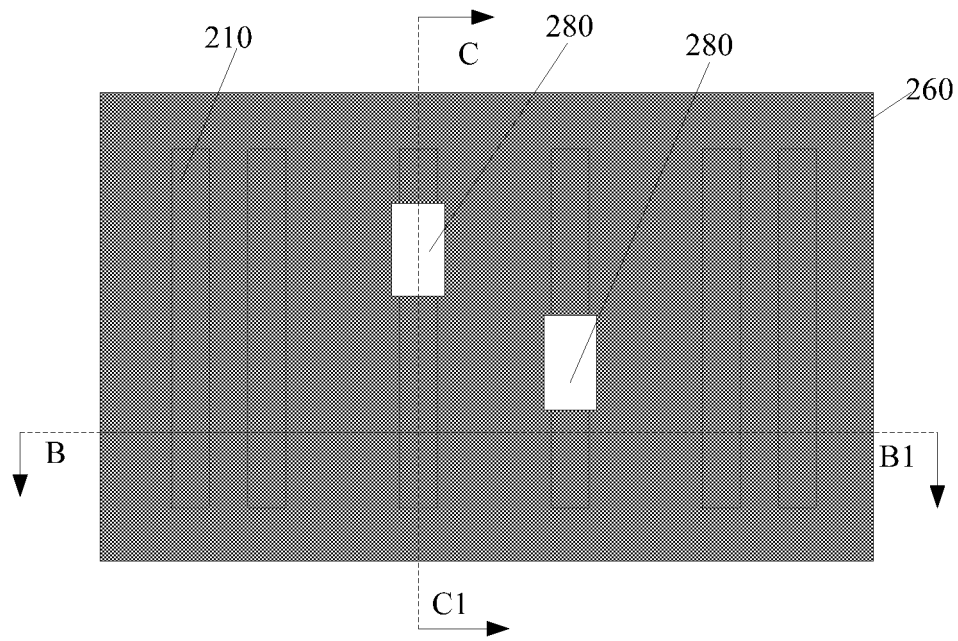

Referring to FIG. 14 and FIG. 15, FIG. 14 is a schematic view based on the structure shown in FIG. 12, FIG. 15 is a schematic view based on the structure shown in FIG. 13, and FIG. 14 is a cross-sectional view along the cutting line C-C1 as shown in FIG. 15. After cutting out a portion of a first-type fin 210 along the extending direction of the first-type fin 210, the second sacrificial layer 270 is removed.

The process of removing the second sacrificial layer 270 includes a dry etching process or a wet etching process.

After the forming of the cutting groove 280 and before the subsequent forming of third trenches and second trenches, the remaining second sacrificial layer 270 is removed.

Figure 16:
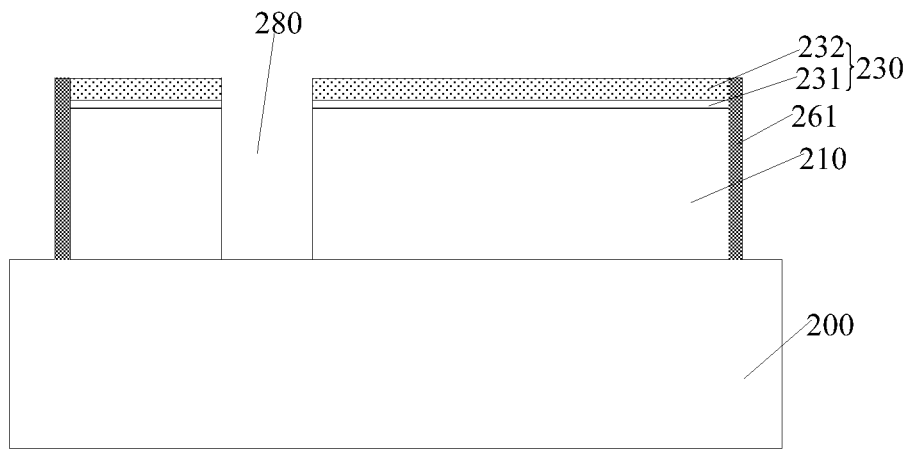
Figure 17:
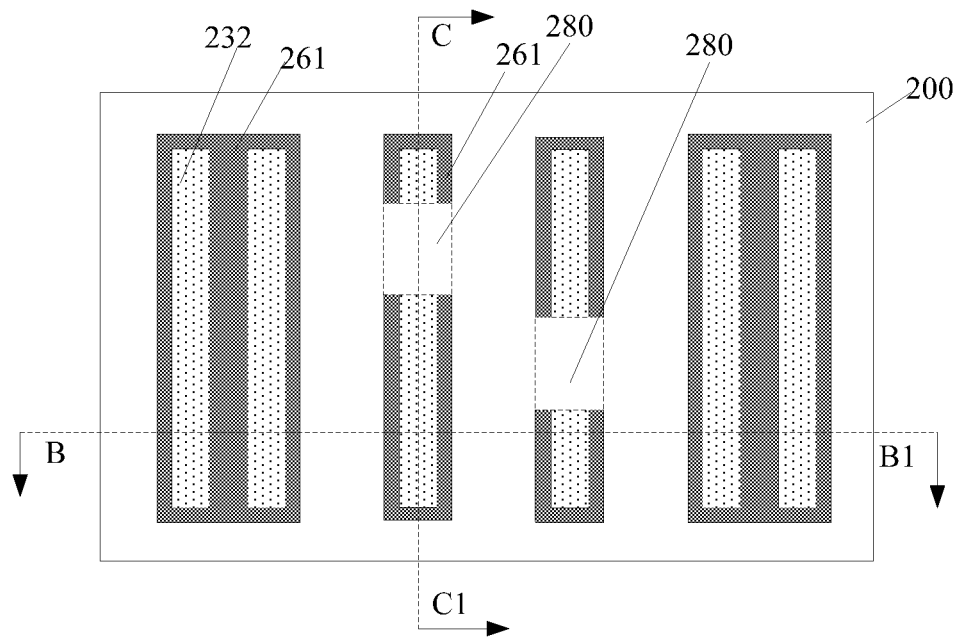
Figure 18:
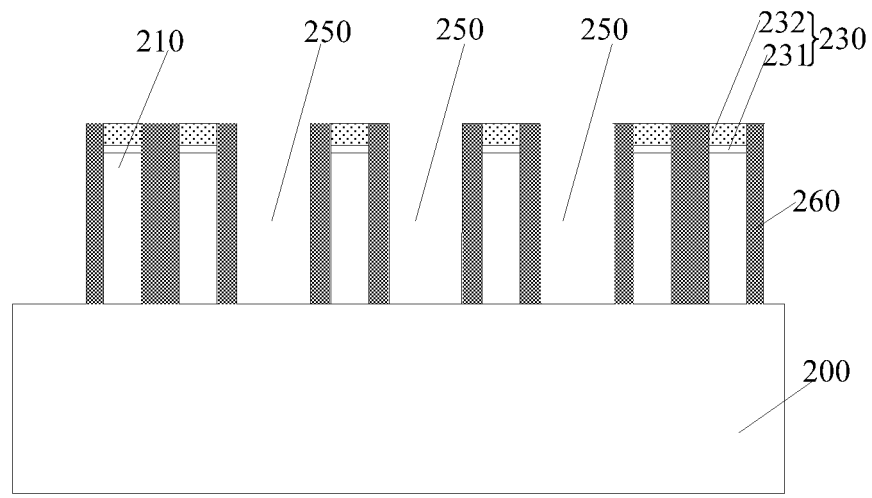

Referring to FIGS. 16-18, FIG. 16 is a schematic view based on the structure shown in FIG. 14, FIG. 17 is a schematic view based on the structure shown in FIG. 15, FIG. 16 is a cross-sectional view along the cutting line C-C1 as shown in FIG. 17, and FIG. 18 is a cross-sectional view along the cutting line B-B1 as shown in FIG. 17. Back-etching the protective film 260 until the substrate 200 under the first trenches 250 is exposed and the protective layer 261 is formed on sidewalls of the first trenches 250. The protective layer 261 covers sidewalls of the first-type fins 210 that are perpendicular to the width direction of first-type fins 210.

In one embodiment, the protective film 260 is back-etched until top surfaces of the substrate 200 and the mask structure 230 at the bottom of first trenches 250 are exposed to form the protective layer 261.

In one embodiment, the protective layer 261 fully fills the groove.

Materials of the protective layer 261 include $SiO_2$, SiN, SiON, or SiC.

Thickness of the protective layer 261 on sidewalls of first trenches 250 is smaller than half-width of a first trench 250 along the width direction of first-type fins 210.

The protective layer 261 on sidewalls of the first trenches 250 has a thickness of 100 angstroms to 200 angstroms.

If the thickness of protective layer 261 on sidewalls of first trenches 250 is greater than 200 angstroms, the over-thick protective layer 261 will lead to a relatively small size of subsequently formed adjacent second trenches along the width direction of the first-type fins, and lead to a relatively small size of second isolation structure in the second trenches along the width direction of the first-type fins, so that the second isolation structure has poor electrical isolation properties.

Figure 19:
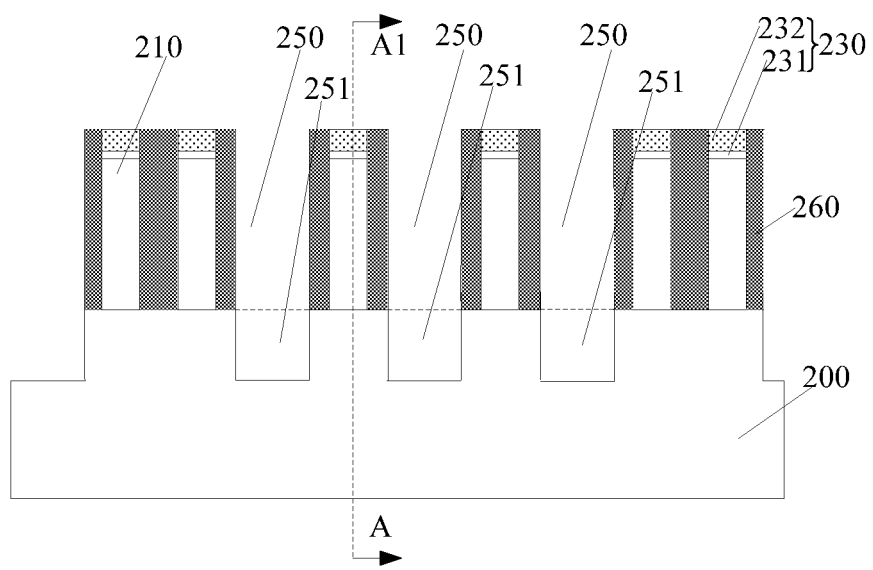

Further, returning to FIG. 21, second trenches may be formed in the substrate under the first trenches by etching the substrate at bottoms of the first trenches using the protective layer as an etch mask (S04). FIG. 19 and FIG. 20 show schematic cross-section views of corresponding semiconductor structures.

Referring to FIG. 19 and FIG. 20, FIG. 19 is a schematic view based on the structure shown in FIG. 18, and FIG. 20 is a cross-sectional view along the cutting line A-A1 as shown in FIG. 19. After forming the protective layer 261, the substrate under the first trenches 250 is etched to form second trenches 251 under the first trenches 250 in the substrate 200.

In one embodiment, the method also includes etching the substrate 200 under the cutting groove 280 to form third trenches 281 during forming second trenches 251. The third trenches 281 are formed under the cutting groove 280 in the substrate 200.

In one embodiment, during etching the substrate 200 under the first trenches 250, ratios of etching rates for the substrate 200 under the first trenches 250 to etching rates for the protective layer 261 are 10:1~20:1.

During etching away the second-type fins, etching rates per unit height for the second-type fins are relatively fast in the direction perpendicular to the surface of the substrate; while during etching the substrate under the first trenches 250 to form the second trenches 251, etching rates per unit height for the substrate are relatively slow in the direction perpendicular to the surface of the substrate, requiring relatively long etching time.

After the etching removal of the second-type fins, a protective layer is formed on sidewalls of the first trenches. The protective layer is positioned on sidewalls of the first-type fins that are perpendicular to the width direction of the first-type fins, thus the protective layer is not subject to loss during the etching removal of the second-type fins. During forming the second trenches, the second trenches can be self-aligned with the protective layer as a mask, and the protective layer defines the distance between the second trenches and their adjacent first-type fins, avoiding position shift of the second trenches. The second trenches do not easily expose the bottom surfaces of first-type fins, avoiding etching damage of the bottom surfaces of first-type fins. Since the protective layer is not damaged in the etching removal of second-type fins, the protective layer can well protect sidewalls of first-type fins facing first trenches during etching the substrate under the first trenches, which avoids etching damage on sidewall surfaces of first-type fins.

In one embodiment, although all the second-type fins are removed by a multiple-step removal, since the critical time point for removing second-type fins 220 and exposing the substrate under the second-type fins 220 is easily detectable, depths of first trenches 250 are basically consistent. In one embodiment, heights of bottom surfaces of all first trenches 250 are uniform. The substrate 200 under the first trenches 250 is etched to form second trenches 251 in the substrate 200 under the first trenches 250. All second trenches 251 are formed in the same etching process. Therefore, depths of all second trenches 251 are the same, and heights of bottom surfaces of second trenches 251 are uniform, leading to consistent isolation performance of subsequent formed second isolation structures.

It should be noted that, in other embodiments, the cutting groove is formed after forming the protective layer, and the cutting groove penetrates the protective layer of sidewalls of first-type fins. Either side of sidewalls of cutting groove perpendicular to the extending direction of first-type fins has no protective layer. In this case, since the width of first-type fins 210 is relatively small, during cutting first-type fins 210 along the extending direction of first-type fins 210, etching rates per unit height for first-type fins in a direction perpendicular to the surface of the substrate are relatively fast, requiring relatively shorter time, while etching rates per unit height for the substrate in a direction perpendicular to the surface of the substrate are relatively slow, requiring relatively longer time. Thus, by comparing etching rates, a critical time point can be easily detected when the substrate 200 is exposed by cutting first-type fins 210 along the extending direction of first-type fins 210.

In other embodiments, the cutting groove is formed after forming the first trenches and before forming the protective layer, that is, forming the cutting groove before forming the protective film. After forming the protective layer, the protective layer is further located at both sides of sidewalls of the cutting groove that are perpendicular to the extending direction of the first-type fins. In this case, since the width of the first-type fins 210 is small, during cutting the first-type fins 210 along the extending direction of the first-type fins 210, etching rates per unit height for the first-type fins in a direction perpendicular to the surface of the substrate are relatively fast, requiring relatively shorter etching time, while etching rates per unit height for the substrate in a direction perpendicular to the surface of the substrate are relatively slow, requiring relatively longer etching time. Thus, by comparing etching rates, a critical time point can be easily detected when the substrate 200 is exposed by cutting first-type fins 210 along the extending direction of first-type fins 210.

In one embodiment, depths of the third trenches 281 are the same, and correspondingly, differences in isolation performance of subsequent formed first isolation structure is small.

In one embodiment, the method also includes: removing the protective layer after forming second trenches; after removing the protective layer, forming first isolation structure in the groove, surface of first isolation structure is lower than top surface of first-type fins; after removing the protective layer, forming second isolation structure in the second trenches and a portion of the first trenches, surface of the second isolation structure is lower than top surface of the first-type fins.

The present disclosure provides a semiconductor device and a method of forming the same to improve performance of semiconductor devices.

The present disclosure provides a method of forming a semiconductor device, including: providing a substrate and forming a plurality of first-type fin groups and second-type fins each between the first-type fin groups on the substrate. The first-type fin groups include first-type fins, and the first-type fins and second-type fins are arranged in a direction perpendicular to the extending direction of first-type fins and second-type fins. The second-type fins are removed to form first trenches between corresponding first-type fin groups. A protective layer is formed on sidewalls of the first trenches after removing the second-type fins. The protective layer covers sidewalls of the first-type fins that are perpendicular to a width direction of the first-type fins. Second trenches are formed in the substrate under the first trenches by etching the substrate at bottoms of the first trenches using the protective layer as an etch mask.

As disclosed, the technical solutions of the present disclosure have the following advantages.

For the method of forming a semiconductor device provided by the present disclosure, since width of the first-type fins is small, etching and removing the second-type fins can be completed in a short period of time, thus the first-type fins have small etching damage. During etching the substrate under the first trenches, the etching time per unit height for the substrate under the first trenches is long. After removing second-type fins, a protective layer is formed on sidewalls of first trenches, and the protective layer covers the sidewalls of first-type fins that are perpendicular to the width direction of first-type fins. The protective layer is not subject to loss caused by the etching removal of second-type fins. During forming the second trenches, the second trenches can be self-aligned with the protective layer as a mask, and the protective layer defines the distance between the second trenches and their adjacent first-type fins, which avoids position shift of the second trenches. The second trenches do not easily expose bottom surfaces of first-type fins, avoiding etching damage of bottom surfaces of the first-type fins. Since the protective layer is not damaged by the removing of second-type fins, the protective layer can well protect sidewalls of the first-type fins facing the first trenches during etching the substrate under first trenches, preventing sidewall surfaces of the first-type fins from being damaged by etching. Thus, performance of the semiconductor device is improved.

In addition, the second trenches are self-aligned with the protective layer as a mask, so that the verticality of sidewalls of second trenches is better.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of forming a semiconductor device, comprising:
    providing a substrate;
    forming a plurality of first-type fin groups and second-type fins each between the first-type fin groups, on the substrate, wherein a first-type fin group includes first-type fins, and the first-type fins and the second-type fins are arranged in a direction perpendicular to an extending direction of the first-type fins and the second-type fins;
    removing the second-type fins to form first trenches between corresponding first-type fin groups;
    forming a protective layer on sidewalls of the first trenches after removing the second-type fins, wherein the protective layer covers sidewalls of the first-type fins that are perpendicular to a width direction of the first-type fins, and the protective layer fully fills up a groove is between adjacent first-type fins; and
    forming second trenches in the substrate under the first trenches by etching the substrate at bottoms of the first trenches using the protective layer as an etch mask.

2. The method according to claim 1, wherein the protective layer is made of a material including SiO2, SiN, SiON, SiC, or a combination thereof.

3. The method according to claim 1, wherein the protective layer has a thickness of 100 angstroms to 200 angstroms.

4. The method according to claim 1, wherein when etching the substrate at the bottoms of the first trenches, a ratio of etching rates of the substrate over the protective layer is in a range between 10:1 and 20:1.

5. The method according to claim 1, wherein:
a dimension of first trenches along the width direction of the first-type fins is larger than a dimension of the groove along the width direction of the first-type fins.

6. The method according to claim 5, wherein forming the protective layer includes:
forming a protective film on the sidewalls and the bottoms of first trenches, inside the groove, and on top of the first-type fins; and
back-etching the protective film until the substrate at the bottoms of first trenches is exposed to form the protective layer.

7. The method according to claim 6, wherein forming the protective film includes an atomic layer deposition process.

8. The method according to claim 5, further including:
before removing the second-type fins, forming a first sacrificial layer on the sidewalls of the first-type fins and the sidewalls of the second-type fins, wherein top surface of the first sacrificial layer is higher or flush with top surfaces of the first-type fins and the second-type fins;
when removing the second-type fins, removing the first sacrificial layer between the first-type fin groups; and
removing the first sacrificial layer beside the first-type fins after removing the second-type fins and before forming the protective layer.

9. The method according to claim 5, further including:
removing the protective layer after forming the second trenches;
forming a first isolation structure in the groove after removing the protective layer, a surface of the first isolation structure is lower than top surfaces of the first-type fins; and
after removing the protection layer, forming a second isolation structure in the second trenches and in a portion region of the first trenches, a surface of the second isolation structure is lower than top surfaces of the first-type fins.

10. The method according to claim 1, wherein a multiple-step removal is used to remove all the second-type fins, each step of the multiple-step removal removes a portion of the second-type fins, and depths of all the second trenches are same.

11. The method according to claim 1, wherein the first-type fins and the second-type fins are formed by a quadruple patterning.

12. The method according to claim 1, wherein the protective layer is made of a material including SiO2, SiN, SiON, SiC, or a combination thereof.

13. The method according to claim 1, wherein the protective layer has a thickness of 100 angstroms to 200 angstroms.

14. The method according to claim 1, wherein when etching the substrate at the bottoms of the first trenches, a ratio of etching rates of the substrate over the protective layer is in a range between 10:1 and 20:1.

15. The method according to claim 1, wherein:
at least a portion of first-type fin groups includes a plurality of first-type fins;
for the plurality of first-type fins in a same first-type fin group, a groove is formed between adjacent first-type fins;
a dimension of first trenches along the width direction of the first-type fins is larger than a dimension of the groove along the width direction of the first-type fins; and
the protective layer fully fills the groove.

16. A method of forming a semiconductor device, comprising:
providing a substrate;
forming a plurality of first-type fin groups and second-type fins each between the first-type fin groups, on the substrate, wherein a first-type fin group includes first-type fins, and the first-type fins and the second-type fins are arranged in a direction perpendicular to an extending direction of the first-type fins and the second-type fins;
removing the second-type fins to form first trenches between corresponding first-type fin groups;
forming a protective layer on sidewalls of the first trenches after removing the second-type fins, wherein the protective layer covers sidewalls of the first-type fins that are perpendicular direction of the first-type fins;
forming second trenches in the substrate under the first trenches by etching the substrate at bottoms of the first trenches using the protective layer as an etch mask;
after forming the first trenches and before forming the second trenches, cutting out a portion of a first-type fin along the extending direction of the first-type fin to form a cutting groove in the first-type fin, and bottom areas of the cutting groove expose the substrate; and
when forming the second trenches, etching the substrate at a bottom of the cutting groove to form third trenches in the substrate under the cutting groove.

17. The method according to claim 16, wherein the cutting groove is formed after forming the protective layer, and the cutting groove penetrates the protective layer on the sidewalls of first-type fins.

18. The method according to claim 16, wherein the cutting groove is formed after forming the first trenches and before forming the protective layer, and after the protective layer is formed, the protective layer is further located on sidewalls of the cutting groove that are perpendicular to the extending direction of the first-type fins.

19. The method according to claim 16, wherein the cutting groove is formed when forming the protective layer.

20. A semiconductor device, comprising:
a substrate;
a plurality of first fin groups on the substrate;
a plurality of second fin groups between adjacent first fin groups of plurality of first fin groups on the substrate, wherein each first fin group includes first fins, each second fin group includes second fins, each first fin has a cutting groove to separate the each first fin to two portions; a distance between adjacent second fins is greater than a distance between adjacent first fins, and the first fins and the second fins are arranged in a direction perpendicular to an extending direction of the first fins and the second fins;
a protective layer on sidewalls of the first fins and the second fins filling up an opening between adjacent first fins;

first trenches between each first fin group and an adjacent second fin group fins in the substrate; and second trenches between adjacent second fins in the substrate under the first trenches, wherein the first trenches, the second trenches, and the cutting groove have a same depth.

* * * * *